(12) United States Patent
Yokoyama et al.

(10) Patent No.: US 8,273,592 B2
(45) Date of Patent: Sep. 25, 2012

(54) METHOD OF MANUFACTURING GROUP-III NITRIDE SEMICONDUCTOR LIGHT EMITTING DEVICE, GROUP III NITRIDE SEMICONDUCTOR LIGHT EMITTING DEVICE AND LAMP

(75) Inventors: Yasunori Yokoyama, Ichihara (JP); Hisayuki Miki, Chiba (JP)

(73) Assignee: Showa Denko K.K., Tokyo (JP)

( * ) Notice: Subject to any disclaimer, the term of this patent is extended or adjusted under 35 U.S.C. 154(b) by 240 days.

(21) Appl. No.: 12/513,595

(22) PCT Filed: Dec. 5, 2007

(86) PCT No.: PCT/JP2007/073472
§ 371 (c)(1),
(2), (4) Date: May 5, 2009

(87) PCT Pub. No.: WO2008/075559
PCT Pub. Date: Jun. 26, 2008

(65) Prior Publication Data
US 2010/0065855 A1 Mar. 18, 2010

(30) Foreign Application Priority Data
Dec. 20, 2006 (JP) .................................. 2006-343019
Aug. 21, 2007 (JP) .................................. 2007-214539

(51) Int. Cl.
*H01L 21/00* (2006.01)
(52) U.S. Cl. ............ 438/47; 257/E21.097; 257/E21.108
(58) Field of Classification Search ..................... 438/47; 257/76, E33.025, E21.097, E21.108
See application file for complete search history.

(56) References Cited

U.S. PATENT DOCUMENTS

| 5,122,845 | A | 6/1992 | Manabe et al. |
| 5,290,393 | A | 3/1994 | Nakamura |

(Continued)

FOREIGN PATENT DOCUMENTS
EP 1 041 609 A1 3/2000
(Continued)

OTHER PUBLICATIONS

Korean Office Action issued Aug. 17, 2011 in the corresponding Korean Patent Application No. 10-2009-7010793.

(Continued)

*Primary Examiner* — Lex Malsawma
(74) *Attorney, Agent, or Firm* — Sughrue Mion, PLLC

(57) ABSTRACT

The object of the present invention is to provide a method of manufacturing a Group-III nitride semiconductor light-emitting device that is highly productive and that enables production of a device having excellent light-emitting properties; a Group-III nitride semiconductor light-emitting device; and a lamp using the light emitting device. The present invention provides a method of manufacturing a Group-III nitride semiconductor light-emitting device, comprising the steps of: activating a gas including a Group-V element and a metal material with plasma, thereby reacting the gas with the metal material; forming on a substrate an intermediate layer that is made of a Group-III nitride compound; and stacking an n-type semiconductor layer that is made of a Group-III nitride semiconductor, a light-emitting layer, and a p-type semiconductor layer, sequentially on the intermediate layer, wherein the Group-V element is nitrogen, the gas fraction of nitrogen in the gas is within a range of more than 20% to less than 99% during forming of the intermediate layer, and the intermediate layer is formed into a single crystal structure.

11 Claims, 6 Drawing Sheets

U.S. PATENT DOCUMENTS

| | | | |
|---|---|---|---|
| 6,713,789 B1 | 3/2004 | Shibata et al. | |
| 6,830,949 B2 * | 12/2004 | Senda et al. | 438/46 |
| 2004/0115817 A1 | 6/2004 | Liu et al. | |
| 2005/0093157 A1 * | 5/2005 | Noguchi et al. | 257/753 |
| 2009/0087936 A1 * | 4/2009 | Miki et al. | 438/46 |
| 2009/0184329 A1 * | 7/2009 | Miki et al. | 257/79 |

FOREIGN PATENT DOCUMENTS

| | | |
|---|---|---|
| EP | 1 296 363 A1 | 3/2003 |
| JP | 60-173829 A | 9/1985 |
| JP | 04-297023 A | 10/1992 |
| JP | 05-311432 A | 11/1993 |
| JP | 09-293897 A | 11/1997 |
| JP | 3026087 B2 | 3/2000 |
| JP | 2000-323753 A | 11/2000 |
| JP | 2003-323753 A | 11/2000 |
| JP | 2001-032068 A | 2/2001 |
| JP | 2001-094150 A | 4/2001 |
| JP | 2001-308010 A | 11/2001 |
| JP | 2003-096561 A | 4/2003 |
| JP | 3440873 B2 | 8/2003 |
| JP | 2004-179457 A | 6/2004 |
| JP | 2005-272894 A | 10/2005 |
| JP | 2006-083459 A | 3/2006 |
| JP | 2006-120841 A | 5/2006 |
| JP | 2006-210578 A | 8/2006 |
| KR | 10-2003-0037223 A | 5/2003 |
| KR | 10-2005-0030500 A | 3/2005 |
| KR | 10-2007-0095364 A | 9/2007 |
| TW | 490866 A | 6/2002 |
| TW | 200610200 A | 3/2006 |
| WO | 03/043097 A1 | 5/2003 |
| WO | 2006-080376 A1 | 8/2006 |

OTHER PUBLICATIONS

Taiwanese Office Action issued in corresponding application No. 096148090 dated Dec. 20, 2011 with English translation.

* cited by examiner

METHOD OF MANUFACTURING GROUP-III NITRIDE SEMICONDUCTOR LIGHT EMITTING DEVICE, GROUP III NITRIDE SEMICONDUCTOR LIGHT EMITTING DEVICE AND LAMP

TECHNICAL FIELD

The present invention relates to a method of manufacturing a group-III nitride semiconductor light emitting device, which is suitable for use not only as a light emitting device (LED), but also as a laser diode (LD), an electronic device or the like, and a lamp.

This application claims the priority of Japanese Patent Application No. 2006-343019, filed on Dec. 20, 2006, and the priority of Japanese Patent Application No. 2007-214539, filed on Aug. 21, 2007, the contents of which are incorporated herein by reference.

BACKGROUND ART

A Group-III nitride semiconductor light emitting device has been utilized as a light emitting device for a LED or LD, because this light emitting device has a direct transition-type band gap that extends over a range from visible light to ultraviolet light, thereby providing excellent light-emitting efficiency.

Furthermore, when used in an electronic device, the Group-III nitride semiconductor provides an electronic device having excellent properties, compared to a semiconductor using a conventional Group-III-V compound semiconductor.

Conventionally, in order to obtain a single crystal Group III nitride semiconductor wafer, a method has generally been used to grow the single crystal Group III semiconductor on a single crystal substrate, which is a heterogeneous material from the single crystal semiconductor. A large lattice mismatch is generated between a heterogeneous substrate and a Group-III nitride semiconductor crystal when it is epitaxially grown on the substrate. For example, when gallium nitride (GaN) is grown on a sapphire ($Al_2O_3$) substrate, the lattice mismatch therebetween reaches to 16%. When gallium nitride is grown on a SiC substrate, the lattice mismatch therebetween is as large as 6%.

In general, if such a big lattice mismatch is there, it is difficult to epitaxially grow a crystal directly on a substrate, or even if it is grown, a crystal having a favorable crystallinity, that is, a single crystal structure can be hardly obtained, and this raises a problem.

In order to solve the problem, a method has been proposed, wherein, when a Group-III nitride semiconductor crystal is epitaxially grown on a sapphire substrate or a SiC single crystal substrate by a metal-organic chemical vapor deposition (MOCVD) method, a so-called "low-temperature buffer layer" made of aluminum nitride (AlN) or aluminum gallium nitride (AlGaN) is first stacked on the substrate, and then, a Group-III nitride semiconductor crystal is epitaxially grown thereon at high temperature. This method has generally been adopted (for example, see Patent document 1 or 2).

Furthermore, the other method for forming the above-described buffer layer has been proposed by applying a method other than the MOCVD method. For example, a method is proposed where a buffer layer is formed by the sputtering method on a substrate including sapphire, silicon, silicon carbide, zinc oxide, gallium phosphide, gallium arsenide, magnesium oxide, manganese oxide, a Group-III nitride-based compound semiconductor single crystals, or the like (for example, see Patent Document 3 or 4).

The methods disclosed in Patent Documents 1 to 4 cannot provide a Group-III nitride semiconductor having a sufficient crystallinity and this also raises a problem.

Furthermore, the other method has also been proposed, wherein, on a buffer layer formed by a high-frequency sputtering method, a crystal having the same composition as the buffer layer is grown by MOCVD (for example, Patent Document 5). However, the method in Patent Document 5 has a problem in that a favorable crystal structure cannot be stably formed on the substrate.

Still other method has also been proposed, wherein, an initial voltage of a sputtering apparatus is set to 110% or less of the sputtering voltage when a buffer layer is formed on the substrate by the sputtering method (for example, Document 6). The method described in Document 6 aims to form a buffer layer by the sputtering method, not using the MOCVD method which uses expensive raw materials.

Patent Document 1: Japanese Granted Patent No. 3026087
Patent Document 2: Japanese Unexamined Patent Application, First Publication No. H4-297023
Patent Document 3: Japanese Granted Patent No. 3440873
Patent Document 4: Japanese Granted Patent No. 3700492
Patent Document 5: Japanese Examined Patent Application, Second Publication No. H5-86646
Patent Document 6: Japanese Unexamined Patent Application, First Publication No. 2001-308010

DISCLOSURE OF THE INVENTION

In the method described in Patent Document 3, a buffer layer is grown, and then, the layer is annealed in a mixed gas including ammonia and hydrogen. In the method described in Patent Document 4, emphasis is placed on a point that a buffer layer is formed by DC sputtering at 400° C. or more. However, a series of experiments conducted by the present inventors revealed that a Group-III nitride semiconductor having a favorable crystallinity cannot be obtained under conditions disclosed in Patent document 3 or 4.

The MOCVD method described in Patent Document 1 or 2 decomposes a material by raising a temperature higher than the decomposition temperature for depositing the decomposition product on a template, and it is known that such a MOCVD method enables to provide a film having a single crystal structure, although the growth rate thereof is low.

In contrast, the sputtering method sputters atoms from a target, and deposits the sputtered atoms forcibly on a substrate to form a film. Although the growth rate thereof is high, the sputtered film does not provide a sufficient crystal structure, compared to the MOCVD film. Therefore, the conventional method, wherein a buffer layer is formed on the substrate by MOCVD, and, then, an undoped GaN layer having a thickness of several micrometers is grown on the buffer layer for enhancing the single crystal structure of a light-emitting layer.

However, even if the buffer layer is formed by the MOCVD method as described above, the thus obtained film does not provide a sufficient crystal structure. Therefore, it has long been sought to be able to provide a method that can provide a buffer layer with an excellent crystallinity or excellent crystal structure.

The present invention has been made under these circumstances and an object of the present invention is to provide a manufacturing method for a Group III nitride semiconductor device, which is highly productive and which enables manufacturing a group-III nitride semiconductor light emitting device that can grow a Group-III nitride semiconductor having excellent uniformity on a substrate within a short amount of time and which can manufacture a device having excellent light-emitting properties; a group-III nitride semiconductor light emitting device; and a lamp.

The present inventors have conducted extensive studies to solve the above-described problems. Consequently, the present inventors have attained the present invention by a method of forming an intermediate layer (a buffer layer) on a substrate as an orientation layer having specific anisotropy by using a method of activating materials with plasma, that is, a sputtering method, having a far higher film-forming rate than the MOCVD method, by compulsive deposition of the film on a substrate, while adjusting a partial pressure of Group V element of nitrogen in a gas system within a suitable range, and the higher forming rate of this method prevents the film from being contaminated by impurities caused by, for example, deposits on the inner wall of the furnace.

Specifically, the present invention relates to the followings.

[1] A method of manufacturing a Group-III nitride semiconductor light-emitting device, comprising: forming an intermediate layer composed of Group-III nitride compound on a substrate by activating a gas and a metal material with plasma; and forming a stack of an n-type semiconductor layer consisting of a Group-III nitride semiconductor, a light-emitting layer, and a p-type semiconductor layer, sequentially formed on the intermediate layer, wherein the Group-V element is nitrogen, a fraction of nitrogen gas in the sputtering gas is controlled to be within a range of more than 20% to less than 99% during forming of the intermediate layer, and the intermediate layer is formed so as to have a single crystal structure.

[2] The method of manufacturing a Group-III nitride semiconductor light-emitting device according to [1], wherein the fraction of nitrogen gas in the gas is within a range of more than 40% to less than 99% during forming of the intermediate layer.

[3] The method of manufacturing a Group-III nitride semiconductor light-emitting device according to [1], wherein the gas fraction of nitrogen in the gas is within a range of more than 75% to less than 99% during forming the intermediate layer.

[4] The method of manufacturing a Group-III nitride semiconductor light-emitting device according to any one of [1] to [3], wherein the intermediate layer is formed by a sputtering method.

[5] The method of manufacturing a Group-III nitride semiconductor light-emitting device according to [4], wherein the intermediate layer is formed by an RF sputtering method.

[6] The method of manufacturing a Group-III nitride semiconductor light-emitting device according to [5], wherein the intermediate layer is formed by an RF sputtering method while moving a magnet of a cathode.

[7] The method of manufacturing a Group-III nitride semiconductor light-emitting device according to any one of [4] to [6], wherein the intermediate layer is formed by a reactive sputtering method which circulates the gas including a Group-V element in a reactor.

[8] The method of manufacturing a Group-III nitride semiconductor light-emitting device according to any one of [1] to [7], wherein the metal material includes Al.

[9] The method of manufacturing a Group-III nitride semiconductor light-emitting device according to any one of [1] to [8], wherein the intermediate layer is formed with AlN.

[10] The method of manufacturing a Group-III nitride semiconductor light-emitting device according to any one of [1] to [9], wherein the intermediate layer is formed while maintaining the temperature of the substrate within a range of room temperature to 1000° C.

[11] The method of manufacturing a Group-III nitride semiconductor light-emitting device according to any one of [1] to [9], wherein the intermediate layer is formed while maintaining the temperature of the substrate within a range of 200° C. to 800° C.

[12] The method of manufacturing a Group-III nitride semiconductor light-emitting device according to any one of [1] to [11], wherein an undercoat layer that is provided with the n-type semiconductor layer is stacked on the intermediate layer.

[13] The method of manufacturing a Group-III nitride semiconductor light-emitting device according to [12], wherein the undercoat layer is formed with a GaN-based compound semiconductor.

[14] The method of manufacturing a Group-III nitride semiconductor light-emitting device according to [13], wherein the undercoat layer is formed with GaN.

[15] The method of manufacturing a Group-III nitride semiconductor light-emitting device according to [13], wherein the undercoat layer is formed with AlGaN.

[16] The method of manufacturing a Group-III nitride semiconductor light-emitting device according to any one of [12] to [15], wherein the intermediate layer and the undercoat layer are formed with different Group-III nitride compounds.

[17] The method of manufacturing a Group-III nitride semiconductor light-emitting device according to any one of [12] to [16], wherein the undercoat layer is formed on the intermediate layer by a MOCVD method.

[18] The method of manufacturing a Group-III nitride semiconductor light-emitting device according to any one of [12] to [17], wherein the temperature of the substrate is adjusted within a temperature range of 800° C. or more during forming of the undercoat layer.

[19] A Group-III nitride semiconductor device that is obtained by the manufacturing method according to any one of [1] to [18].

[20] A Group-III nitride semiconductor light-emitting device, comprising an intermediate layer consisting of a Group-III nitride compound that is formed on a substrate by activating a gas including a Group-V element and a metal material with plasma, thereby reacting the gas with the metal material; and an n-type semiconductor layer consisting of a Group-III nitride semiconductor, a light-emitting layer, and a p-type semiconductor layer is sequentially stacked on the intermediate layer, wherein the intermediate layer is formed while the Group-V element is nitrogen, the gas fraction of nitrogen in the gas is within a range of more than 20% to 99%, and the intermediate layer is formed to be a single crystal structure.

[21] The Group-III nitride semiconductor light-emitting device according to [20], wherein the intermediate layer is formed while the Group-V element is nitrogen and the gas fraction of nitrogen in the gas is within a range of more than 40% to less than 99%.

[22] The Group-III nitride semiconductor light-emitting device according to [20], wherein the intermediate layer is formed while the Group-V element is nitrogen and the gas fraction of nitrogen in the gas is within a range of more than 75% to less than 99%.

[23] The Group-III nitride semiconductor light-emitting device according to any one of [20] to [22], wherein the intermediate layer includes Al.

[24] The Group-III nitride semiconductor light-emitting device according to [23], wherein the intermediate layer is made of AlN.

[25] The Group-III nitride semiconductor light-emitting device according to any one of [20] to [24], wherein the intermediate layer is formed so as to cover at least 90% of the surface of the substrate.

[26] The Group-III nitride semiconductor light-emitting device according to any one of [20] to [25], wherein the intermediate layer is formed so as to cover at least side surface of the substrate.

[27] The Group-III nitride semiconductor light-emitting device according to any one of [20] to [26], wherein the intermediate layer is formed so as to cover at least the side surface and the rear surface of the substrate.

[28] The Group-III nitride semiconductor light-emitting device according to any one of [20] to [27], wherein the intermediate layer is composed of a single crystal.

[29] The Group-III nitride semiconductor light-emitting device according to any one of [20] to [28], wherein the thickness of the intermediate layer is within a range of 20 to 80 nm.

[30] The Group-III nitride semiconductor light-emitting device according to any one of [20] to [29], wherein an undercoat layer provided in the n-type semiconductor layers is stacked on the intermediate layer.

[31] The Group-III nitride semiconductor light-emitting device according to [30], wherein the undercoat layer is made of a GaN-based compound semiconductor.

[32] The Group-III nitride semiconductor light-emitting device according to [31], wherein the undercoat layer is made of GaN.

[33] The Group-III nitride semiconductor light-emitting device according to [31], wherein the undercoat layer is made of AlGaN.

[34] A lamp that is formed by using the Group-III nitride semiconductor light-emitting devices according to any one of [19] to [33].

According to the method of manufacturing a Group-III nitride semiconductor light-emitting device of the present invention, an intermediate layer having a single crystal structure is formed on a substrate by adopting the method of activating raw materials by plasma in the above-described arrangement, and the partial pressure of nitrogen that is a Group-V element is adjusted within a suitable range. Consequently, the method of manufacturing of the present application is capable of forming an intermediate layer which has excellent uniformity and is also capable of subsequently forming a Group-III nitride semiconductor having excellent crystal structure on the intermediate layer by MOCVD.

Accordingly, the present method enables efficiently growing an intermediate layer of a Group-III nitride compound with an excellent crystal structure on a substrate, and enables producing a Group-III nitride semiconductor device provided with excellent light-emitting properties in a very productive manner at a reasonable price.

Figure 1:
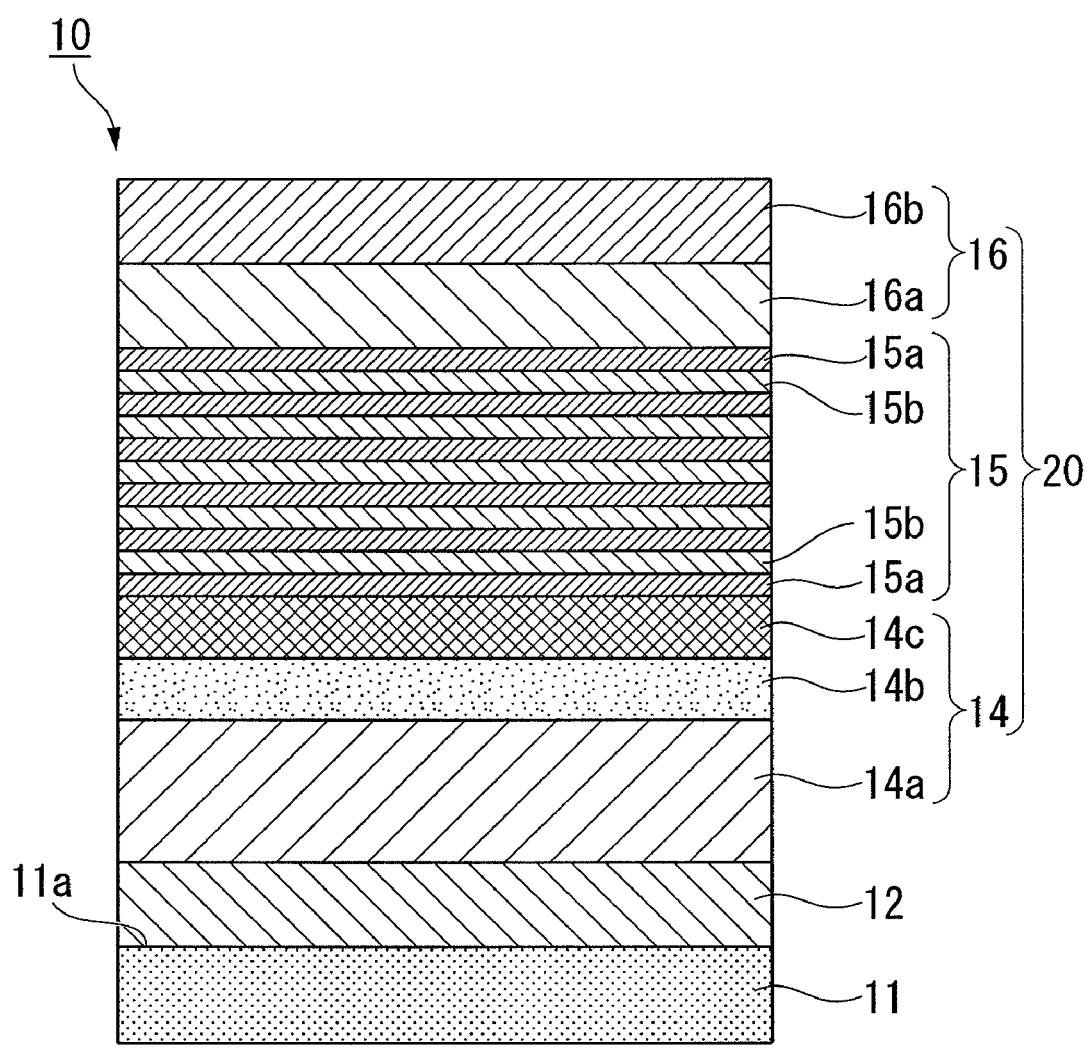
FIG. 1 is a diagram showing one example of a Group-III nitride semiconductor light-emitting device according to the present invention and illustrating a cross-sectional structure of the stacked semiconductor device.

The reference numeral "1" refers to a Group-III nitride semiconductor light-emitting device; the reference numeral "10" refers to a stacked semiconductor; the reference numeral "11" refers to a substrate; the reference numeral "11a" refers to a surface; the reference numeral "12" refers to an intermediate layer; the reference numeral "13" refers to an undercoat layer; the reference numeral "14" refers to an n-type semiconductor layer; the reference numeral "14a" refers to an undercoat layer; the reference numeral "15" refers to a light-emitting layer; the reference numeral "16" refers to a p-type semiconductor layer; the reference numeral "17" refers to a transparent anode; and the reference numeral "3" refers to a lamp.

BEST MODE FOR CARRYING OUT THE INVENTION

Hereinafter, an embodiment of a method of manufacturing a Group-III nitride semiconductor light-emitting device, a Group-III nitride semiconductor light-emitting device, and the lamp using the light emitting device according to the present invention are described with reference to FIGS. 1 to 6.

A method of manufacturing a Group-III nitride semiconductor light-emitting device (hereinafter, optionally abbreviated as "a light emitting device") according to the present invention is a method comprising: forming an intermediate layer 12 made of a Group III nitride compound on a substrate by activating a gas including a Group-V element and a metal material with plasma, thereby reacting the gas with the metal material; and stacking an n-type semiconductor layer 14 made of a Group-III nitride semiconductor, a light-emitting layer 15, and a p-type semiconductor layer 16, sequentially formed on the intermediate layer 12, wherein the Group-V element is nitrogen, the gas fraction of nitrogen in the gas is controlled within a range of more than 20% to less than 99% during forming of the intermediate layer, and the intermediate layer is formed to be a single crystal structure.

[Stacked Structure of the Light-Emitting Device]

The schematic structure of the Group-III nitride semiconductor light-emitting device according to the present embodiment comprises: an intermediate layer made of a Group-III nitride compound that is formed on a substrate by activating a gas including a Group-V element and a metal material with plasma to react them with each other; and an n-type semiconductor layer made of a Group-III nitride semiconductor, a light-emitting layer, and a p-type semiconductor layer, sequentially stacked on the intermediate layer; and the intermediate layer is formed while the Group-V element is nitrogen and the gas fraction of nitrogen in the gas is within a range of more than 20% to less than 99%, and the intermediate layer is formed to be a single crystal structure.

FIG. 1 is a diagram explaining one example of a Group-III nitride semiconductor light-emitting device according to the present invention and illustrating a schematic cross-sectional structure of the stacked semiconductor.

In a stacked semiconductor 10 shown in FIG. 1, an undercoat layer 14a made of a Group-III nitride semiconductor is stacked on the intermediate layer 12 that is formed on the substrate 11. The stacked semiconductor 10 comprises the intermediate layer 12; the n-type semiconductor layer 14 including the undercoat layer 14a, an n-type contact layer 14b, and an n-type clad layer 14c; the light-emitting layer 15 where a barrier layer 15a and a well layer 15b are alternately stacked; the p-type semiconductor layer 16 that includes a p-type clad layer 16a and a p-type contact layer 16b are sequentially stacked on the substrate 11.

Figure 2:
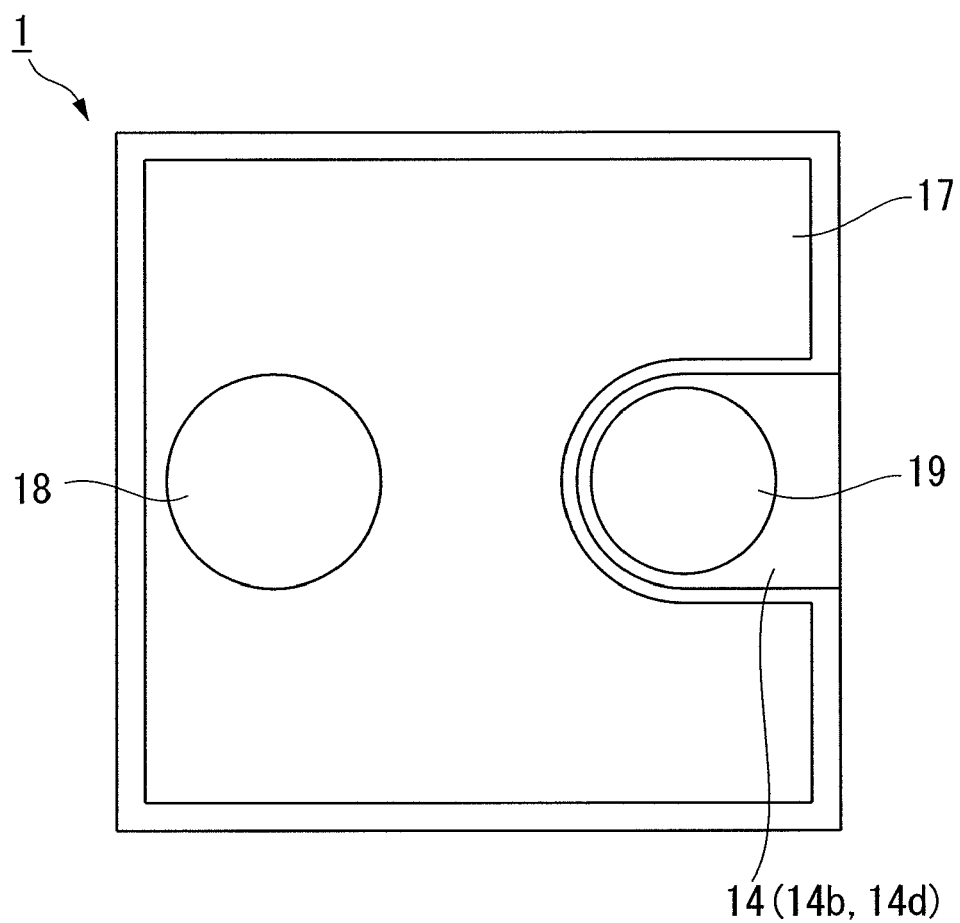
FIG. 2 is a diagram showing one example of a Group-III nitride semiconductor light-emitting device according to the present invention and illustrating a planar structure thereof.
Figure 3:
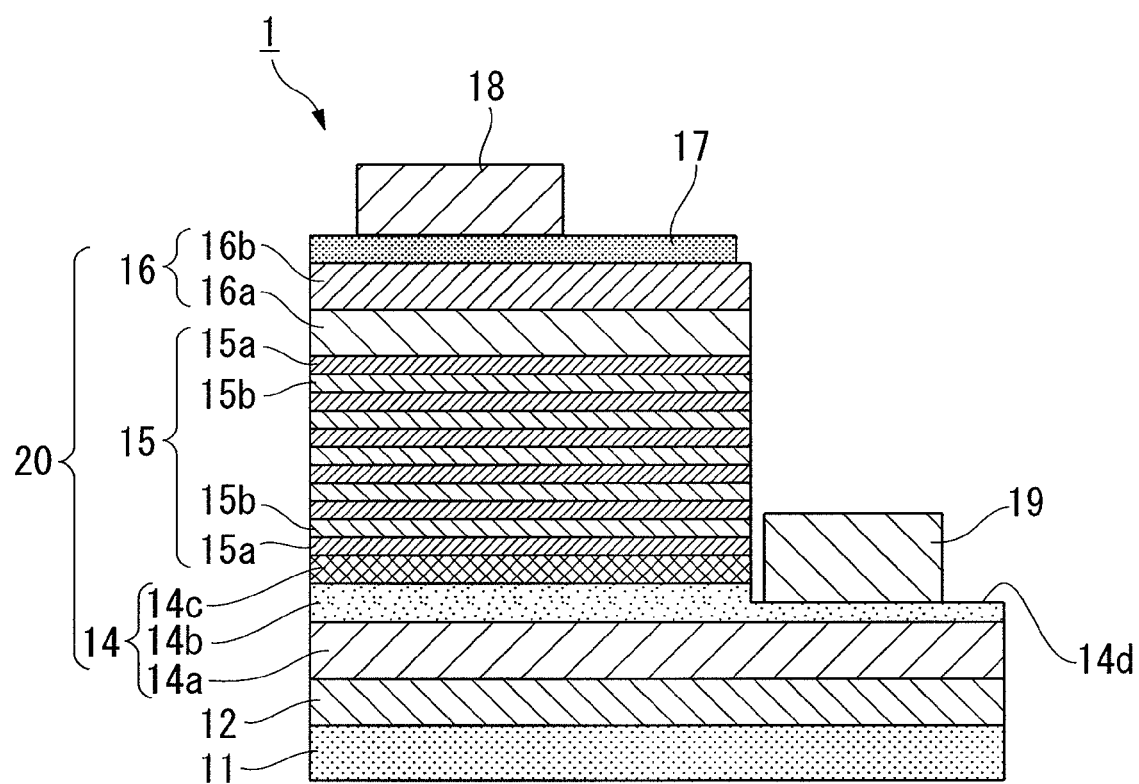
FIG. 3 is a diagram showing one example of a Group-III nitride semiconductor light-emitting device according to the present invention and illustrating the cross-sectional structure thereof.

As shown in FIGS. 2 and 3, the stacked semiconductor 10 according to the present embodiment forms a light-emitting device 1 where a transparent anode 17 is stacked on the p-type semiconductor layer 16, an anode-bonding pad 18 formed thereon, a cathode 19 stacked on an exposed region 14d of the n-type contact layer 14b in the n-type semiconductor layer 14.

Hereinafter, the stacked structure of the Group-III nitride semiconductor light-emitting device according to the present embodiment will be described in detail.

[Substrate]

In the present embodiment, a material of the substrate 11, on which Group-III nitride semiconductor crystals are to be epitaxially grown on the surface, is not particularly limited, and various materials can be selected. Examples of the substrate includes sapphire, SiC, silicon, zinc oxide, magnesium oxide, manganese oxide, zirconium oxide, zinc iron manganese oxide, aluminum magnesium oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten, and molybdenum.

When the intermediate layer is formed without using ammonia while the undercoat layer described below is formed by a method using ammonia, and, when, among the above-mentioned substrate materials, an oxide substrate or a metal substrate is used, which is known to be chemically deteriorated by being in contact with ammonia at high temperature, the intermediate layer according to the present embodiment functions as a protective coating layer, and prevents the substrate from being chemically deteriorated.

[Intermediate Layer]

In the stacked semiconductor 10 according to the present embodiment, an intermediate layer consisting of a Group III nitride compound is formed on the substrate 11 by activating and forming a metal nitride by reacting a metal material and a gas including a Group-V element. The film formed by activating a metal and nitrogen by plasma, as described above in the present embodiment, tends to be easily oriented.

In a Group-III nitride semiconductor device for an LED or an LD, it is required that an electric current flows in a predetermined direction. Therefore, a Group-III nitride semiconductor device is required to have a favorable crystal structure and orientation. Since the group-III nitride semiconductor device is epitaxially grown on the intermediate layer 12, the intermediate layer 12 is also required to have a favorable crystal structure and orientation.

In the case where the Group-III nitride semiconductor is grown by the MOCVD method, since the MOCVD method forms a layer by stacking metal elements generated by decomposing an organic metal molecule, a backing layer that functions as a template is required to provide a favorable crystal orientation. If the intermediate layer 12 is a low-temperature buffer layer formed on the substrate 11, a limited sort of materials can be used as the substrate 11.

In contrast, if the Group-III nitride semiconductor is grown by a reactive sputtering method, sputtered particles in the plasma not always exist in a state of atoms, but exist as charged particles, such as dimmers having bonds. Such charged particles are used as raw materials for forming a film. Since the charged particle has a moment, the charged particles will be affected by an electric field in sputtering, thereby the particles are deposited on the substrate 11 having specific anisotropy. Due to the anisotropy, the film exhibits an orientation structure. Accordingly, an oriented film can be formed by a sputtering method on any type of substrate.

It is required that the intermediate layer 12 cover at least 60% of the surface 11a of the substrate 11, and preferably 80% or more thereof. It is more preferable from the functional point of view, that the intermediate layer 12 covers 90% or more of the surface 11a of the substrate 11. Furthermore, it is most preferable that the intermediate layer 12 covers 100% of the surface 11a (i.e. the intermediate layer 12 is formed to conceal the total surface 11a of the substrate 11).

If the region where the intermediate layer 12 covers the surface 11a of the substrate 11 is small, a large portion of the substrate 11 is exposed, and therefore, the intermediate layer 12 will not function as a coat layer. Thus, a reaction will occur between a semiconductor material used for growing Group-III nitride semiconductor crystals and the substrate 11, and the flatness of the n-type semiconductor layer formed on the intermediate layer 12 will be failed.

In addition, when the intermediate layer 12 is formed on the substrate 11, the intermediate layer 12 may be formed so that the intermediate layer 12 only covers the front surface 11a of the substrate 11. However, it is more preferable that the intermediate layer is formed so as to cover both the surface 11a and the side planes of the substrate 11. Furthermore, it is most preferable that the intermediate layer 12 covers the front surface 11a, side planes and the rear surface of the substrate 11 in terms of its function as a protective coat layer.

In the MOCVD method, the material gas may reach the side planes or the rear surface of the substrate. Therefore, if any one of the layers, described below, that is made of Group-III nitride semiconductor crystals is formed by the MOCVD method, it is preferable that the intermediate layer be formed to protect the side planes of the substrate, or even the rear surface thereof so as to prevent the material gas from reacting with the substrate.

Furthermore, it is preferable that the intermediate layer 12 is formed into a single crystal structure in terms of its buffering function. As described above, a crystal of a Group-III nitride compound has a hexagonal crystal structure, and forms a structure based on a hexagonal column. By controlling conditions for depositing the film or the like, the crystals of a Group-III nitride compound can be formed into crystals that grow even in the in-plane direction. When the intermediate layer 12 having such a single crystal structure is formed on the substrate 11, since the buffering function of the intermediate layer 12 positively acts, a Group-III nitride compound semiconductor layer formed thereon will be formed into a crystalline film having excellent orientation and an excellent crystal structure.

It is preferable that the thickness of the intermediate layer 12 is within a range of 20 to 80 nm. When the thickness of the intermediate layer 12 is within such a range, an intermediate layer 12 having an excellent crystal structure can be formed on the substrate 11 as an oriented film having specific anisotropy in a short amount of time.

If the thickness of the intermediate layer 12 is below 20 nm, not only it is not possible to form the intermediate layer having a favorable crystal structure with specific anisotropy, but also it is not provided with a sufficient function as a protective coat layer.

In contrast, if the intermediate layer 12 at a thickness of more than 80 nm is formed, the layer is not provided with a favorable crystal structure having specific anisotropic orientation, and a longer film-forming time is required so that the productivity is reduced, although its function as a protective coat layer does not change.

It is preferable that the intermediate layer 12 includes Al, and it is particularly preferable that the intermediate layer is made of AlN.

Regarding the materials that constitute the intermediate layer, any materials can be used as long as they are Group-III nitride semiconductors represented by a general formula "AlGaInN". Furthermore, the material may include As or P as a Group-V element.

When the intermediate layer 12 includes Al, it is preferable that the material may be GaAlN. In this case, it is preferable that the content of Al is 50% or more.

In addition, a sufficiently-oriented layer can be obtained, in the case where the intermediate layer 12 is made of AlN.

[Stacked Semiconductor]

As shown in FIG. 1, the stacked semiconductor 10 according to the present embodiment comprises an n-type semiconductor 14 made of a nitride-based compound semiconductor, and a semiconductor layer 20 consisting of the light-emitting layer 15 and the p-type semiconductor layer 16 stacked on the substrate 11 via the above-described intermediate layer 12.

Furthermore, the n-type semiconductor 14 includes at least an undercoat layer 14a made of a Group-III nitride semiconductor, and the undercoat layer 14a is stacked on the intermediate layer 12.

On the undercoat layer 14a made of a Group-III nitride semiconductor, as described above, a crystal stack structure having a function such as the stacked semiconductor 10 shown in FIG. 1 can be formed. For example, in the case where a semiconductor stack structure for a light-emitting device is formed, an n-type conductive layer doped with an n-type dopant such as Si, Ge and Sn, or a p-type conductive layer doped with a p-type dopant such as magnesium and the like can be stacked to form the stacked semiconductor. In addition, a material such as InGaN can be used as a light-emitting layer, and AlGaN can be used as a clad layer.

As described above, by forming Group-III nitride semiconductor crystal functional layers on the undercoat layer 14a, a wafer having a semiconductor stacked structure for use as a light-emitting diode, laser diode, electronic device or the like can be produced.

Hereinafter, the stacked semiconductor 10 is described in detail.

As nitride-based compound semiconductor, for example, many gallium nitride-based compound semiconductors represented by a general formula $Al_xGa_yIn_zN_{1-A}M_A$ (where $0 \leq x \leq 1$, $0 \leq y \leq 1$, $0 \leq z \leq 1$, and $x+y+z=1$; and the symbol "M" shows the other Group-V element other than nitrogen (N); and $0 \leq A \leq 1$) have been known. In the present invention, it is possible to use without any limitations any known gallium nitride-based compound semiconductors, namely those represented by general formula $Al_xGa_yIn_zN_{1-A}M_A$ (where $0 \leq x \leq 1$, $0 \leq y \leq 1$, $0 \leq z \leq 1$, and $x+y+z=1$; the symbol "M" shows the other Group-V element other than nitrogen (N); and $0 \leq A \leq 1$).

The gallium nitride-based compound semiconductor can contain the other Group-III elements other than Al, Ga and In, and the other elements may contain Ge, Si, Mg, Ca, Zn, Be, P, and As or the like where necessary. In addition, the gallium nitride-based compound semiconductor may contain impurities that are inevitably contained according to the film-forming conditions, or a small amount of impurities included in raw materials or materials in a reaction equipment.

[N-Type Semiconductor Layer]

The n-type semiconductor layer 14 is generally stacked on the intermediate layer 12, and includes an undercoat layer 14a, an n-type contact layer 14b, and an n-type clad layer 14c. Additionally, the n-type contact layer 14b is used as a layer serving both as an undercoat layer and an n-type clad layer. The undercoat layer may also be a layer serving as an n-type contact layer and an n-type clad layer.

(Undercoat Layer)

The undercoat layer 14a is made of a Group-III nitride semiconductor, and is formed by stacking on the intermediate layer 12.

As a material for the underling layer 14a, a material different from the intermediate layer 12 may be used. However, it is preferable that the undercoat layer 14a is formed as a layer of an $Al_xGa_{1-x}N$ ($0 \leq x \leq 1$, preferably $0 \leq y \leq 0.5$, and more preferably $0 \leq x \leq 0.1$).

As the material used for the undercoat layer 14a, a Group-III nitride compound containing Ga, that is, GaN-based compound semiconductor, is preferably used. In particular, AlGaN or GaN can be preferably used.

Moreover, the undercoat layer is required to prevent from forming dislocation in a loop of migration so as not to succeed the crystal structure of the intermediate layer 12. As an example of such a material, the above-described GaN-based compound semiconductor containing Ga such as AlGaN or GaN is preferable.

The thickness of the undercoat layer is preferably 0.1 μm or more, more preferably 0.5 μm or more, and most preferably 1 μm or more. When the thickness thereof is controlled to be more than these values, it is easy to obtain an $Al_xGa_{1-x}N$ layer having an excellent crystal structure.

The undercoat layer 14a may be doped with a dopant where necessary, but may also be undoped.

When an electro-conductive substrate is used as the substrate 11, as described above, the undercoat layer 14a can be doped such that an electric current flows in the vertical direction. In such a case, it is possible to adopt a configuration in which electrodes are provided on both sides of the chip of the light emitting device.

On the other hand, when an insulating substrate is used as the substrate 11, it is necessary to adopt a chip structure where electrodes are provided on one side of the chip of the light-emitting device. The undercoat layer 14a stacked on the substrate 11 via intermediate layer 12 can be formed as undoped crystals, and such an undercoat layer may provide more preferable crystal structure than the doped undercoat layer.

(N-Type Contact Layer)

In the same manner as the undercoat layer 14a, it is preferable that the n-type contact layer 14b is formed by use of an $Al_xGa_{1-x}N$ layer ($0 \leq x \leq 1$, preferably $0 \leq y \leq 0.5$, and more preferably $0 \leq x \leq 0.1$). Additionally, it is preferable that n-type impurities be doped therein, and such n-type impurities are preferably contained at a concentration of $1 \times 10^{17}$ to $1 \times 10^{19}/cm^3$, or preferably $1 \times 10^{18}$ to $1 \times 10^{19}/cm^3$ with respects to maintenance of its preferable ohmic contact with a cathode, suppression of crack-generation, and maintenance of its excellent crystal structure. The n-type impurities are not particularly limited. However, examples of the dopant include Si, Ge, Sn or the like and Si and Ge are preferable. The growth temperature of the n-type contact layer is the same as that for the undercoat layer. As described above, the n-type contact layer 14b can be configured as a layer serving also as the undercoat layer.

The gallium nitride-based compound semiconductors that constitute the undercoat layer 14a and the n-type contact layer 14b preferably have the same composition. The total thicknesses of these layers is preferably within a range of 0.1 to 20 μm, preferably within a range of 0.5 to 15 μm, and more preferably within a range of 1 to 12 μm. If the total thicknesses thereof is within such a range, the crystal structure of the semiconductors can be reliably maintained.

(N-Type Clad Layer)

It is preferable that an n-type clad layer 14c is provided between the n-type contact layer 14b and the light-emitting layer 15 which is described below. If such an n-type clad layer 14c is provided, then deterioration in flatness of the outermost surface of the n-type contact layer 14c can be improved. The n-type clad layer 14c can be formed with AlGaN, GaN, GaInN or the like. In addition, the n-type clad layer 14c may be configured into a hetero junction structure or into a superlattice structure, where a plurality of the hetero junction structures are repeatedly stacked. When the n-type clad layer 14c is formed with GaInN, it is a matter of course that the band gap of the clad layer is preferably larger than that of GaInN of the light-emitting layer 15.

Although the thickness of the n-type clad layer 14c is not particularly limited, the thickness is preferably within a range of 5 to 500 nm, and more preferably within a range of 5 to 100 nm.

Additionally, the n-type dope concentration of the n-type clad layer 14c is preferably within a range of $1\times10^{17}$ to $1\times10^{20}/cm^3$, and more preferably, $1\times10^{18}$ to $1\times10^{19}/cm^3$.

When the dope concentration is within such a range, it is preferable to maintain an excellent crystal structure and to reduce the working voltage of the light-emitting device.

[P-Type Semiconductor Layer]

The p-type semiconductor layer 16 generally includes a p-type clad layer 16a and a p-type contact layer 16b. However, the p-type contact layer may be a layer serving also as a p-type clad layer.

(P-Type Clad Layer)

The composition of the p-type clad layer 16a is not particularly limited, as long as its composition is in a range where the band gap energy thereof is larger than that of the light-emitting layer 15 and its composition is in a range where carriers can be confined in the light-emitting layer 15. It is preferable to use a p-type clad layer of $Al_dGa_{1-d}N$ (wherein $0<d\leq0.4$, and preferably $0.1\leq d\leq0.3$). It is preferable to use the p-type clad layer 16 is AlGaN of the above-described composition range because such a p-type clad layer enables to confine carries in the light emitting layer 15. The thickness of the p-type clad layer 16a is not particularly limited. However, the thickness thereof is preferably 1 to 400 nm, and more preferably 5 to 100 nm. The p-type doping concentration in the p-type clad layer 16a is preferably within a range of $1\times10^{18}$ to $1\times10^{21}/cm^3$, and more preferably $1\times10^{19}$ to $1\times10^{20}/cm^3$. If the p-type dope concentration is within such a range, a preferable p-type crystal can be obtained without impairing the crystal structure.

(P-Type Contact Layer)

The p-type contact layer 16b is a gallium nitride-based compound semiconductor layer that includes at least $Al_eGa_{1-e}N$ (wherein $0\leq e\leq0.5$, and preferably $0.1\leq e\leq0.1$). If the Al composition is within such a range, reliable maintenance of the crystal structure, and excellent ohmic contact with a p-ohmic electrode (see the transparent electrode 17 described below) can be achieved, and is, therefore, preferable.

Moreover, it is preferable that the p-type contact layer 16b contains a p-type dopant at a concentration within a range of $1\times10^{18}$ to $1\times10^{21}/cm^3$, and preferably $1\times10^{18}$ to $1\times10^{19}/cm^3$ in order to maintain its preferable ohmic contact, to suppress crack-generation, and to maintain its excellent crystal structure. It is more preferable that the p-type contact layer 16b contain a p-type dopant within a range of $5\times10^{19}$ to $5\times10^{20}/cm^3$.

P-type impurities included therein are not particularly limited. For example, Mg is a preferable example.

The thickness of the p-type contact layer 16b is not particularly limited. However, the thickness thereof is preferably within a range of 10 to 500 nm, and more preferably 50 to 200 nm. When the thickness thereof is within such a range, preferable light-emission output can be obtained.

[Light-Emitting Layer]

The light-emitting layer 15 is a layer that is stacked on the n-type semiconductor layer 14 and on which the p-type semiconductor layer 16 is stacked. As shown in FIG. 1, in order to form the light-emitting layer 15, barrier layers 15a made of a gallium nitride-based compound semiconductor, and well layers 15b made of an indium-containing gallium-nitride-based compound semiconductor are alternately stacked such that barrier layers 15a are disposed at the side adjacent to the n-type semiconductor layer 14 and the p-type semiconductor layer 16.

Moreover, in the example shown in FIG. 1, the light-emitting layer 15 is formed by alternately stacking six layers of barrier layers 15a and five layers of well layers 15b, and the barrier layers 15a are disposed at the top and the bottom of the light-emitting layer 15, and well layers 15b are each disposed between barrier layers 15a.

As the barrier layer 15a, for example, a gallium nitride-based compound semiconductor such as $Al_cGa_{1-c}N$ ($0\leq c<0.3$), whose band gap energy is lager than that of the well layer 15b made of an indium-containing gallium nitride-based compound semiconductor can be preferably used.

As an indium-containing gallium nitride-based compound semiconductor for the well layer 15b, for example, an indium gallium nitride such as $Ga_{1-s}In_sN$ ($0\leq s<0.4$) can be used.

Furthermore, the total thickness of the light-emitting layer 15 is not particularly limited. However, it is preferable that the thickness is within a thickness range at which a quantum effect can be obtained, that is, within a critical thickness range. For example, the thickness of the light-emitting layer 15 is preferably within a range of 1 to 500 nm, and it is more preferable that the thickness is about 100 nm. When the thickness is within such a range, it contributes to improvement of the light-emission output.

[Transparent Anode]

The transparent anode 17 is a transparent electrode that is formed on the p-type semiconductor layer 16 in the stack semiconductor 10.

A material for the transparent anode 17 is not particularly limited. A material such as ITO ($In_2O_3$—$SnO_2$), AZO (ZnO—$Al_2O_3$), IZO ($In_2O_3$—ZnO), or GZO (ZnO—$Ga_2O_3$) can be applied using methods generally known in the art. In addition, any structure including known structures can be adopted for the transparent anode.

The transparent anode 17 may be formed, covering the total surface of the Mg-dope p-type semiconductor layer 16, or may be formed in a grid pattern or tree-form providing spaces therebetween. After the transparent anode 17 is formed, a heat-annealing treatment may be conducted in order for alloying the anode or for making the anode transparent. However, such a treatment is not always required.

[Anode Bonding Pad and Cathode]

The anode bonding pad 18 is an electrode that is provided on the above-described transparent anode 17.

As a material for the anode bonding pad 18, various materials and various structures using Au, Al, Ni, Cu or the like are known, and such known materials and known structures can be used without any limitations.

It is preferable that the thickness of the anode bonding pad 18 is within a range of 100 to 1000 nm. Moreover, from the view point of properties of the bonding pad, a higher bonding ability can be obtained when the thickness is of the bonding pad is thicker. Therefore, the thickness of the anode bonding pad 18 is preferably adjusted to 300 nm or more. Furthermore, with respect to the production cost, it is preferable that the thickness is 500 nm or less.

The cathode 19 is provided so as to be in contact with the n-type contact layer 14b in the n-type semiconductor layers 14 in the semiconductor layer comprising the n-type semiconductor layer 14, the light-emitting layer 15, and the p-type semiconductor layer 16 sequentially stacked on the substrate 11.

According to such a structure, in order to form the cathode 19, portions of the p-type semiconductor layer 16, the light-emitting layer 15 and the n-type semiconductor layer 14 are removed to form an exposed region 14d on the n-type contact layer 14b, and the cathode 19 is formed on the exposed region 14d.

As a material for the cathode 19, various types of compositions and structures are known. Such known materials and structures of cathodes can be used without any limitations, and the cathode can be provided using a general method known in the art.

[Method of Manufacturing a Group-III Nitride Semiconductor Light-Emitting Device]

The method of manufacturing a Group-III nitride semiconductor light-emitting device according to the present embodiment is a method, as described above, comprising: forming an intermediate layer 12 made of a Group-III nitride compound on the substrate 11 by activating and reacting a gas including a Group-V element and a metal material with plasma; and stacking, on the intermediate layer 12, an n-type semiconductor layer 14, a light-emitting layer 15, and a p-type semiconductor layer 16, sequentially stacked on the intermediate layer 12, wherein the Group-V element is nitrogen, the gas fraction of nitrogen in the gas is within a range of more than 20% to less than 99% while forming of the intermediate layer 12, and the intermediate layer 12 is formed in a single crystal structure.

The manufacturing method according to the present embodiment is a method where, when Group-III nitride semiconductor crystal is epitaxially grown on the substrate 11, for example, the materials reacted by plasma-activation is deposited on the substrate 11 to form the intermediate layer 12. The intermediate layer 12 is formed while the nitrogen-gas fraction in the reactor gas is within the above-described range, and thus the intermediate layer having an excellent crystal structure can be formed in a short amount of time on the substrate 11 as an oriented film having specific anisotropy. Consequently, a Group-III nitride semiconductor having a sufficient crystal structure can be efficiently grown on the intermediate layer 12.

In the example shown in the present embodiment, after the intermediate layer 12 is formed by a sputtering method, an undercoat layer 14a of the n-type semiconductor layer 14 is formed by a MOCVD method, the n-type contact layer 14b and n-type clad layer 14c are respectively formed by a sputtering method. The light-emitting layer 15 provided thereon is formed by a MOCVD method, and then, a p-type clad layer 16a and a p-type contact layer 16b that constitute a p-type semiconductor layer 16 are respectively formed by a sputtering method.

[Formation of the Intermediate Layer]

Before the intermediate layer 12 is formed on the substrate 11, it is preferred that the substrate 11 is subjected to a wet pretreatment. For example, the RCA cleaning method which is well-known in the art is conducted for a substrate 11 made of silicon, and its surface is hydrogen-terminated to stabilize the film-forming process.

Furthermore, before the intermediate layer 12 is formed after the substrate is transferred into a reactor (a sputtering apparatus), it is preferable to conduct a pretreatment using a reverse sputtering method. For example, the substrate 11 is exposed to the plasma of Ar or $N_2$ in order to adjust the surface of the substrate.

When the surface of the substrate 11 is exposed to the plasma of an Ar or $N_2$ gas, organic substances or oxides adhered to the surface of the substrate 11 can be removed. While exposing the plasma on the substrate surface, if a voltage is applied between the substrate and the chamber, the plasma particles will efficiently affects the surface of the substrate 11.

By conducting such a pretreatment on the substrate 11, the intermediate layer 12 can be formed on the total surface 11a of the substrate 11 and the crystal structure of the film formed can be enhanced.

Furthermore, with regard to the pretreatment to the substrate, it is preferable that the plasma treatment is conducted in an atmosphere composed of a mixture of both ions and radicals, as described above.

In order to remove contaminants, such as organic materials or oxides, from the surface of the substrate, a problem may occur, if the pretreatment is conducted by a plasma composed only of ions, because the plasma having excessively strong energy deteriorates the quality of the substrate surface and therefore, the quality of the crystal structure of the film to be formed on the substrate surface.

In the present invention, the pretreatment of the substrate 11 is conducted using a plasma treatment under an atmosphere, comprising a mixture of ions and radicals. A plasma consisting of reaction species having proper energy is subjected on the substrate 11 and contaminants can be removed without deteriorating the surface of the substrate 11. In order to remove contamination from the surface of the substrate without deteriorating the substrate surface, an effective factor is to use a plasma where an ion content is reduced so as to be lower than the radical content.

Examples of the method of forming the intermediate layer 12 on the substrate 11, in addition to a sputtering method where a high voltage is applied under a specific degree of vacuum to generate electric discharge, include the MOCVD method, a pulsed laser deposition (PLD) method wherein plasma is generated by irradiating a laser having high energy density, and a pulsed electron beam deposition (PED) method where electron beams are irradiated to generate plasma. An appropriate method can be selected from such methods. However, the sputtering method is simplest, and is suitable for mass production, and is, therefore, a preferable method.

In addition, when film-forming is conducted using a nitrogen gas as a Group-V element by the sputtering method, it is known that nitrogen is adsorbed to the surface of the target (metal material) (See Mat. Res. Soc. Symp. Proc. Vol. 68, 357, 1986). In general, when a target of a metal material is used to conduct sputtering, the DC sputtering method is preferred in terms of its film-forming efficiency. However, there is a concern that adsorption of nitrogen on the target surface may cause charge build-up in the target in the case of the DC sputtering method, which results in unstable film-forming rate. Therefore, use of the pulsed DC sputtering method or the RF sputtering method is preferable.

In sputtering methods, it has been a general method where plasma is trapped inside the magnetic field to improve the efficiency. As a method that enables unbiased and homogeneous utilization of the target, the RF sputtering method where film-forming is conducted while moving the position of the cathode magnet in the target is preferably used. Specifically, an appropriate method of moving the magnet can be selected depending on the type of sputtering apparatus. For example, the magnet can be swung or rotated.

Figure 5:
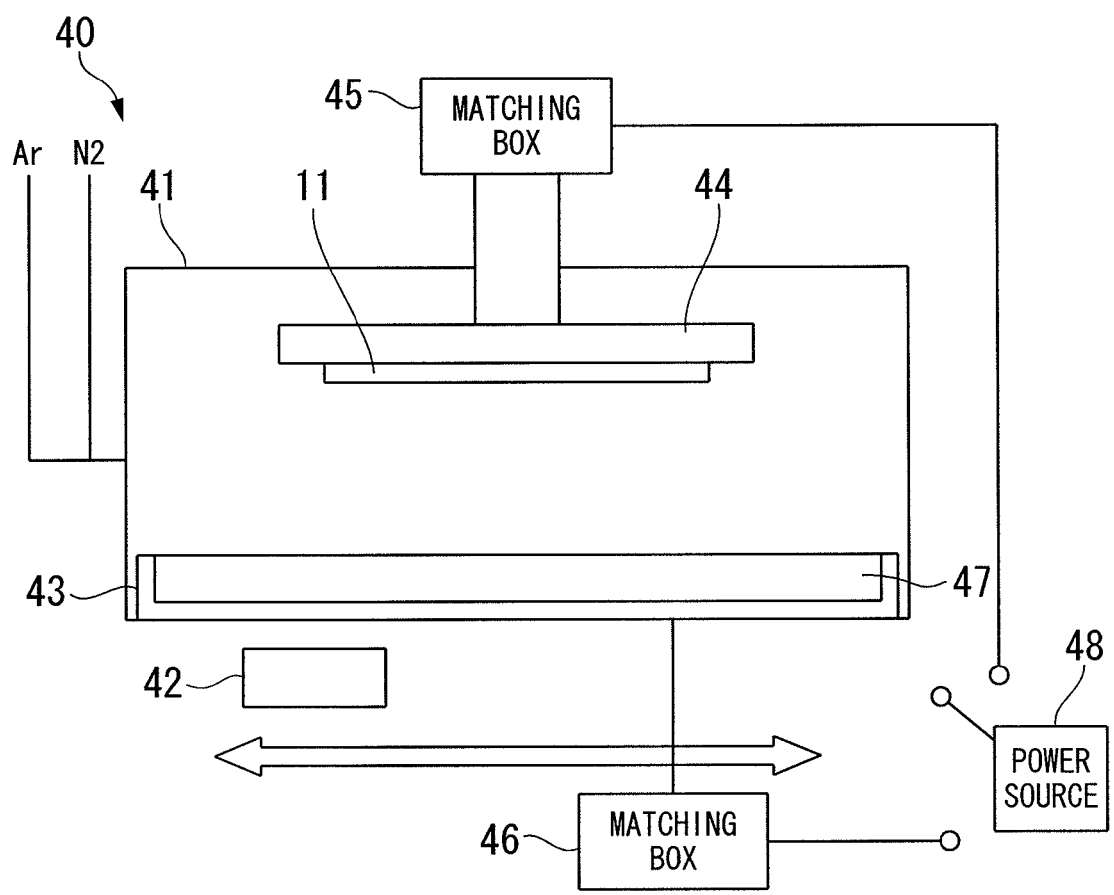
FIG. 5 is a diagram showing one example of a method of manufacturing a Group-III nitride semiconductor light-emitting device according to the present invention and illustrating a structure of the sputtering apparatus.

In an RF sputtering apparatus 40 shown in FIG. 5, a magnet 42 is disposed below a metal target 47 (downward in FIG. 5), the magnet 42 is swung below the metal target 47, being actuated by an actuating device not shown in the Figure. Nitrogen gas and argon gas are supplied to a chamber 41, and an intermediate layer is formed on a substrate disposed on the heater 44. Because the magnet 42 is swung below the metal target 47 in this case, as described above, the plasma trapped inside the chamber 41 moves, the intermediate layer can be formed uniformly not only on the front surface 11a of the substrate 11 but also on the side planes thereof.

Furthermore, when forming the intermediate layer 12 using the sputtering method, it is preferable that a reactive sputtering method where a gas containing nitrogen is circulated inside the reactor to be used to form a film because a preferable crystal structure can be obtained by controlling the reaction and the preferable crystal structure stably reproduced.

In addition, when forming the intermediate layer 12 using the sputtering method, and especially in the reactive sputtering method, the nitrogen partial pressure, or the pressure inside the reactor are important parameters in addition to the temperature of the substrate 11.

With regard to the nitrogen gas fraction in the reactor gas containing nitrogen, that is, the ratio of the nitrogen flow rate to the total flow rate of nitrogen ($N_2$) and Ar, it is preferable that the ratio of the nitrogen flow rate is more than 20%. If the ratio of the nitrogen flow rate is under 20%, then, metals will be deposited on the substrate 11 due to the lower amount of nitrogen, and a crystal structure required for the Group-III nitride compound of the intermediate layer 12 cannot be obtained. On the other hand, in the case of a flow rate where the ratio of nitrogen exceeds 99%, the amount of Ar is too low, so that the sputter rate is excessively reduced. Therefore, such a range is not preferable. The nitrogen gas fraction in the gas containing nitrogen is preferably within a range of more than 40% to less than 99%, or more preferably within a range of more than 75% to less than 99%.

In the present embodiment, a high concentration of active nitrogen reaction species is supplied onto the substrate 11 so that migration on the substrate 11 can be suppressed. Accordingly, self-organization is suppressed, and the intermediate layer 12 is accommodated with a suitable single crystal structure. By controlling the intermediate layer 12 so as to form an appropriate single crystal structure, the crystal structure of the semiconductor layer made of GaN that is stacked thereon can be preferably controlled.

Moreover, it is preferable that the pressure inside the chamber during forming of the intermediate layer 12 using the sputtering method is 0.2 Pa or more. If the pressure inside the chamber is under 0.2 Pa, the kinetic energy of the generated reaction species becomes too high, and the quality of the film of the intermediate layer will become insufficient. The upper limit of the pressure inside the chamber is not particularly limited. However, if the pressure is 0.8 Pa or more, dimmer charged particles that contribute to orientation of the film interact with charged particles in the plasma. Therefore, it is preferable that the pressure inside the chamber is within a range of 0.2 to 0.8 Pa.

It is preferable that the film-forming rate for the intermediate layer 12 is within a range of 0.01 nm/s to 10 nm/s. If the film-forming rate is under 0.01 nm/s, a film is not formed in a shape of a layer, but the deposit is grown into an island shape, and the film cannot cover the total surface of the substrate 11. If the film-forming rate exceeds 10 nm/s, the film is not crystalline, but becomes amorphous.

The temperature of the substrate during forming the intermediate layer 12 is preferably within a range of room temperature to 1000° C., or more preferably within a range of 200° C. to 800° C. If the temperature of the substrate 11 is under the lower limit, the intermediate layer 12 cannot cover the total surface of the substrate 11, and the surface of the substrate 11 may be exposed. In contrast, if the temperature of the substrate 11 exceeds the upper limit, the intermediate layer may not have an appropriate function as the buffer layer because migration of the metal materials becomes too active.

In addition, since the above-described room temperature in the present invention, is not necessarily defined and the room temperature is affected by environments, the room temperature of the present application is defined to be within a range of 0° C. to 30° C.

When a mixed crystal film is formed as an intermediate layer using the film-forming method by sputtering metal materials, it is possible to use, for example, a method where a mixture of metal materials containing Al, etc. (where it is unnecessary for the mixture to form an alloy) is used as a target; or a method where two targets made of different materials are used for simultaneous sputtering In particular, when forming a film having a constant composition, a target made of the mixed materials may be used. In order to form several types of films having different compositions, a plurality of targets may be set inside the chamber.

As the gas containing nitrogen (Group-V element) used in the present embodiment, generally-known nitrogen compounds can be used without any limitations. However, ammonia or nitrogen ($N_2$) is preferable since they are both easily handled and available at a low price.

Ammonia has a preferable decomposition efficiency, and enables film-forming at a high growth rate. However, since its reactivity and toxicity is high, therefore, an installation for preventing injury of the gas or a gas-detection equipment is necessary, and it is further required that materials used for the reaction apparatus have high chemical stability.

In contrast, when nitrogen ($N_2$) is used as a raw material, a simple apparatus can be used, but a high reaction velocity can not be obtained. However, if a method where nitrogen is first decomposed by an electric field or by heat, and then the decomposed nitrogen is introduced into the apparatus is adopted, it becomes possible to achieve a film-forming rate, which can be applicable to the industrial production thereof, although the film-forming rate may be slower than that when ammonia is used. Therefore, nitrogen ($N_2$) is the most preferable nitrogen source, when the cost of the film forming apparatus is also taken into consideration.

As described above, it is preferable that the intermediate layer 12 is formed such that the intermediate layer 12 also covers the side planes of the substrate. Furthermore, it is the most preferable that the intermediate layer 12 is formed such that the intermediate layer 12 also covers both of the side planes and the rear surface of the substrate 11. However, when an intermediate layer is formed using conventional film-forming methods, it is required to conduct a film-forming treatment about six to eight times, and it takes long time to complete the whole process. Other than this film-forming method, another possible method may be presumed that a substrate is disposed in the chamber without holding the substrate and the film is formed from every side of the substrate. However, when it is required to heat the substrate, there is a concern that the heating apparatus may be complex.

Therefore, for example, a method is considered where the film is formed while changing the position of the substrate by swinging or rotating the substrate. If such a method is adopted, the film can be formed on the surface and the side planes of the substrate at one step, and subsequently, a film-forming step is conducted with respect to the rear surface of the substrate. That is, every surface of the substrate can be covered by two steps.

Moreover, since it is possible to adopt a method where the film-forming material source has a large area, and the position of the source is moved, the film can be formed on the whole surface of the substrate without moving the substrate. An example of such a method, as described above, includes the RF sputtering method where the magnet is swung or rotated and where the film-forming is conducted while moving the position of the cathode magnet inside the target. Furthermore, when film-forming is conducted by such an RF sputtering method, it is possible to adopt an apparatus where both the substrate and the cathode are movable. Additionally, by disposing the cathode of the material emission source in the vicinity of the substrate such that the generated plasma may be supplied to the substrate not in the form of a beam but in the form so as to wrap the substrate, it becomes possible to cover both a flat surface and a side planes of the substrate simultaneously.

[Formation of Semiconductor Layer]

In the manufacturing method according to the present embodiment, the semiconductor layer 20 made of a Group-III nitride semiconductor is formed on the intermediate layer 12 that is preliminary formed on the substrate 11. In the present embodiment, after an undercoat layer 14a of an n-type semiconductor layer 14 in the semiconductor layer 20 is formed using the MOCVD method, an n-type contact layer 14b and an n-type clad layer 14c are formed using the sputtering method, and then, a p-type clad layer 16a and a p-type contact layer 16b that constitutes a p-type semiconductor layer 16 are formed using the reactive sputtering method.

In the manufacturing method according to the present embodiment, the method for growing a gallium nitride-based compound semiconductor to form the semiconductor layer 20 is not particularly limited. Besides the reactive sputtering method using the above-described manufacturing method and manufacturing apparatus according to the present embodiment, all known methods such as MOCVD (metal-organic chemical vapor deposition), HYPE (halide vapor-phase epitaxy), and MBE (molecular beam epitaxy), can be applied. The MOCVD method is a preferable method for growing a semiconductor in terms of its controllability and mass productivity. In the MOCVD method, the following compounds are used: hydrogen ($H_2$) or nitrogen ($N_2$) as a carrier gas; trimethyl gallium (TMG) or triethyl gallium (TEG) as a Ga-source; trimethyl aluminum (TMA) or triethyl aluminum (TEA) as an Al-source; trimethyl indium (TMI) or triethyl indium (TEI) as an In-source; and ammonia ($NH_3$) or hydrazine ($N_2H_4$) as an N-source (Group-V material). Furthermore, examples of the n-type doping source include mono-silane ($SiH_4$) or disilane ($Si_2H_6$) as Si-dopant; germane gas ($GeH_4$), or organic germanium compounds such as tetramethyl germanium (($CH_3$)$_4$Ge) or tetraethyl germanium (($C_2H_5$)$_4$Ge) as Ge-dopant. In the MBE method, an elemental form of germanium can also be used as a doping source. Examples of Mg-materials used for the p-type doping source include bis(cyclopentadienyl)magnesium ($Cp_2Mg$) or bis(ethylcyclopentadienyl)magnesium ($EtCp_2Mg$).

The above-described gallium nitride-based compound semiconductor may include other Group-III elements other than Al, Ga and In, and may include a dopant element such as Ge, Si, Mg, Ca, Zn and Be where necessary. Furthermore, in addition to the intentionally-added elements, the semiconductor may include impurities that are inevitably included depending on the film-forming conditions, and a small amount of impurities included in raw materials or in materials of the reaction pipe.

(Formation of N-Type Semiconductor Layer)

When the semiconductor layer 20 according to the present embodiment is formed, the undercoat layer 14a in the n-type semiconductor layer 14 is first stacked on the intermediate layer 12 using a conventionally-known MOCVD method. Subsequently, an n-type contact layer 14b and an n-type clad layer 14c are formed on the undercoat layer 14a using the sputtering method. In addition, the n-type contact layer 14b and the n-type clad layer 14c are formed using the same sputtering apparatus.

As a method of forming the undercoat layer 14a made of a single-crystal Group-III nitride semiconductor on the substrate 11, as shown in the present embodiment, there is a method where an intermediate layer 12 made of AlN is formed on the substrate 11 using the sputtering method, and subsequently, a single crystal GaN layer is formed thereon by the MOCVD method at a temperature higher than the temperature for forming the intermediate layer 12.

In the present embodiment, after the intermediate layer 12 is formed on the substrate 11 by the above-described method, an annealing treatment is not particularly required before forming the undercoat layer 14a. However, when the film of a Group-III nitride semiconductor is formed using a vapor-phase chemical method such as MOCVD, MBE or VPE, such a method generally includes a temperature-rising step and a temperature-stabilizing step before forming the undercoat layer. A Group-V material gas is often introduced into the chamber in these temperature rising and temperature stabilizing steps. As a result, an annealing effect can be obtained in these steps.

Furthermore, a general carrier gas can be used as the carrier gas for flowing during these steps without any limitations. For example, hydrogen or nitrogen can be used which is frequently used in vapor-phase chemical film-forming methods such as MOCVD. However, when hydrogen is used, since hydrogen is relatively chemically-active, the crystal structure or evenness of the crystal surface may be impaired. Therefore, it is preferable that the time for the treatment must be completed within a short amount of time.

The method of stacking the undercoat layer 14a is not particularly limited, and any methods can be used without any limitations as long as the method can prevent from forming dislocation by forming a loop. In particular, the MOCVD method, the MBE method, or the VPE method is preferable because these methods can cause the above-described migration, thereby forming a film having the sufficient crystal structure. Particularly, the MOCVD method is more preferable because a film having an excellent crystal structure can be obtained.

Furthermore, the undercoat layer 14a made of a Group-III nitride semiconductor can be formed using the sputtering method. When the sputtering method is used, the apparatus thereof can be made simpler, compared to the MOCVD method or the MBE method.

In addition, when the undercoat layer 14a is formed by the sputtering method, it is more preferable that the film-forming is conducted by the reactive sputtering method wherein a Group-V material (nitrogen) is circulated inside of the chamber. This is because the sufficient crystal structure can be maintained by controlling the reaction, and such sufficient crystal structure can be stably reproduced.

The temperature of the substrate 11 during forming of the undercoat layer 14a, that is, the temperature for growing the undercoat layer 14a, is preferably 800° C. or more. This is because atomic migration is easily generated by controlling the temperature of the substrate 11 during forming of the undercoat layer 14a to a higher temperature, so that looping of dislocation by migration easily proceeds. The temperature of the substrate is more preferably 900° C. or more, and the most preferably 1000° C. or more.

It is also required that the temperature of the substrate 11 during forming of the undercoat layer 14a is lower than the temperature at which crystals decompose, and therefore, it is preferable that the temperature is less than 1200° C.

Accordingly, the temperature for growing the undercoat layer 14a is preferably within a range of more than 800° C. to less than 1200° C., more preferably within a range of more than 900° C. to less than 1200° C., or most preferably within a range of more than 1000° C. to less than 1200° C. If the temperature for growing the undercoat layer 14a is within such a temperature range, an undercoat layer 14a having an excellent crystal structure can be obtained.

Additionally, an undercoat layer 14a can be formed in an undoped state without supplying a doping element including a donor impurity such as Si to the chamber of the sputtering apparatus. In contrast, when forming the n-type contact layer 14b and an n-type clad layer 14c, a GaN layer whose conductivity is controlled to be the n-type is obtained by supplying a doping element into the chamber of the sputtering apparatus.
(Formation of Light-Emitting Layer)

A light-emitting layer 15 is formed on the n-type clad layer 14c using the conventionally-known MOCVD method. As shown in FIG. 1, the light-emitting layer 15 formed in the present embodiment includes a stacked structure starting from a GaN barrier layer and ending by a GaN barrier layer; and six barrier layers 15a made of Si-doped GaN, and five well layers 15b made of undoped $In_{0.2}Ga_{0.8}N$ are alternately stacked.
(Formation of P-Type Semiconductor Layer)

On the light-emitting layer 15, that is, on the barrier layer 15a corresponding to a top layer of the light-emitting layer 15, a p-type semiconductor layer 16 including a p-type clad layer 16a and a p-type contact layer 16b is formed using the above-described reactive sputtering method according to the manufacturing method of the present embodiment.

In the present embodiment, a p-type clad layer 16a made of Mg-doped $Al_{0.1}Ga_{0.9}N$ is first formed on the light-emitting layer 15 (i.e. the top layer of the barrier layer 15a), and then, a p-type contact layer 16b made of Mg-doped $Al_{0.02}Ga_{0.98}N$ is formed thereon. In this case, the same sputtering apparatus can be used for stacking the p-type clad layer 16a and the p-type contact layer 16b.

In the film-forming operation of the p-type semiconductor layers 16 including the p-type clad layer 16a and the p-type contact layer 16b, the above-described manufacturing method according to the present embodiment is used, while supplying a dopant element of an acceptor impurity (Mg) into the sputter chamber 41 so as to control the conduction type of the GaN layer into the p-type semiconductor layer 16 by adding the acceptor impurity.
[Formation of Transparent Cathode]

Using the above-described method, a transparent cathode 17 made of ITO is formed on the p-type contact layer 16b of the stacked semiconductor 10, formed by sequentially stacked on the substrate 11 via the intermediate layer 12.

The method of forming the transparent cathode 17 is not particularly limited, and the transparent cathode can be provided using any method, generally well-known in the art. Also, any transparent cathode having any conventionally known structures can be used without any limitations.

Furthermore, as described above, materials for the transparent cathode 17 is not limited to ITO, and materials such as AZO, IZO, or GZO can be used to form the cathode.

Additionally, after the transparent cathode 17 is formed, the transparent cathode 17 may be subjected to a heat-annealing treatment. However, such a treatment is not always required.
[Formation of Cathode Bonding Pad and Anode]

A cathode bonding pad 18 is further formed on the transparent cathode 17 that is formed on the laminate semiconductor 10.

For example, materials of Ti, Al, and Au may be successively stacked on the surface of the transparent cathode 17 to form the cathode bonding pad 18

In order to form the anode 19, a portion of the light-emitting layer 15, the p-type semiconductor layer 16, and the n-type-semiconductor layer 14 is first removed by using a method such as dry-etching to form an exposed region 14d of the n-type contact layer 14b (See FIGS. 2 and 3).

Then, for example, materials of Ni, Al, Ti and Au are successively laminated on the surface of the exposed region 14d using a conventionally-known method enabling formation of an anode 19 having a four-layer structure.

Furthermore, the rear surface of the substrate 11 of a wafer, where the transparent cathode 17, the cathode bonding pad 18 and the anode 19 are provided on the stacked semiconductors 10, as described above, is finished into a mirror surface by grinding and polishing. Then, the wafer is cut, for example, into a 350 μm square, thereby obtaining a light-emitting device chip (light-emitting device 1).

As described above, according to the method of manufacturing a Group-III nitride semiconductor light-emitting device of the present embodiment, an intermediate layer 12 having a single crystal structure is formed on a substrate 11 using the method of sputtering by activating materials by plasma, while the partial pressure of nitrogen belonging to the Group-V element is defined as being in the above-described range. Accordingly, not only the intermediate layer 12 of a well crystallized film having excellent uniformity can be formed in a short amount of time, but the intermediate layer 12 can also be formed as an oriented film having anisotropy on any types of the substrate 11. Furthermore, since the film-forming rate of the intermediate layer 12 is improved, it is possible to prevents impurities such as in-furnace deposits from contaminating the film. Additionally, the intermediate layer 12 is formed as a single crystal structure so that the intermediate layer 2 effectively functions as a buffer layer. Consequently, the semiconductor layer 20 of a Group-III nitride semiconductor formed thereon can be formed into a crystal film having a single crystal structure.

Accordingly, the intermediate layer 12 made of a Group-III nitride compound having excellent crystal structure, and the semiconductor layer 20 made of a Group-III nitride semiconductor can be efficiently grown on the substrate 11, and it becomes possible to obtain a Group-III nitride semiconductor light-emitting device 1 in a highly productive and cost-saving manner, and the thus obtained light emitting device has excellent light-emitting properties.

[Lamp]

By combining the Group-III nitride semiconductor light-emitting device, as described above, with a fluorescent phosphor, it is possible to constitute a lamp by the methods known to those skilled in the art. Conventionally, it has been known to provide a method of modifying the color of the emitted-light by combining a light-emitting device with a phosphor, and such a method can be adopted without any limitations.

For example, if a phosphor is appropriately selected, an emission light whose wave-length is longer than the light-emitting device can be obtained. Moreover, if mixing the wave-length of the light emitted from the light-emitting device itself with the wave-length converted by the phosphor, a lamp that emits white light can be produced.

In addition, the lamp can be used in any type of applications such as a bullet-shaped type lamp for general use, a side-view type lamp used for a portable backlight, or a top-view type lamp used in a display.

Figure 4:
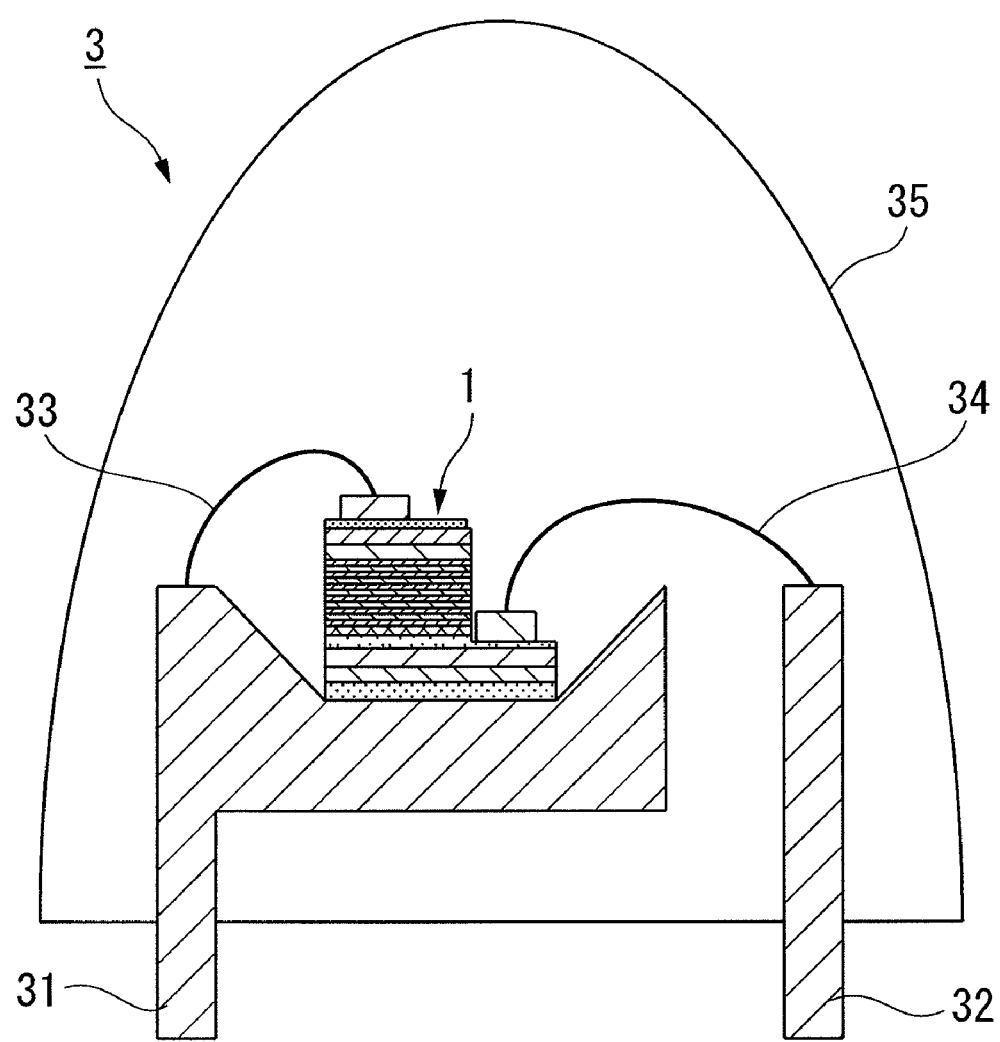
FIG. 4 is a diagram schematically showing a lamp provided by using a Group-III nitride semiconductor light-emitting device according to the present invention.

For example, as shown in FIG. 4, in a case where a Group-III nitride semiconductor light-emitting device 1 having electrodes disposed on the same plane is packaged in a bullet-type lamp, the light-emitting device 1 is adhered to one of two frames (frame 31 shown in FIG. 4), the cathode of the light-emitting device 1 (reference numeral 19 shown in FIG. 3) is connected to the other frame 32 with a wire 34, and the anode bonding pad (numeral symbol 18 shown in FIG. 3) is connected to the frame 31 with a wire 33. Then, the light-emitting device 1 is packaged in a mold 35 made of a transparent resin to produce a bullet-shaped lamp 3 shown in FIG. 4.

In addition, the Group-III nitride compound laminate semiconductor of the present invention can be used for a photoelectric conversion device such as a laser device or light receiving element, or an electronic device such as HBT or HEMT other than the above-described light-emitting device. These semiconductor devices having various configurations are known, the structures of the semiconductor devices formed by stacking on the undercoat layer 14a of the light-emitting device 1 according to the present embodiment are not particularly limited, including known device structures.

EXAMPLE

Next, the Group-II nitride semiconductor light-emitting device will be described with reference to the Example in detail. However, the present invention is not limited to the Example.

A stacked semiconductor of a Group-III nitride semiconductor light-emitting device prepared in the present Example is shown in FIG. 1 illustrating its cross section.

In the present Example, an AlN layer having a single crystal structure was formed as an intermediate layer 12 on the c-plane of a sapphire substrate 11 using the RF sputtering, and a GaN layer was formed thereon as an undercoat layer 14a using the MOCVD method.

First, a sapphire substrate 11, with one surface that was mirror-finished to a grade that can be used for epitaxial growth thereon, was loaded in a sputtering apparatus without conducting any particular pre-treatment such as a wet treatment. The sputtering apparatus provided with a high-frequency power supply and a mechanism that moves the position of the magnet in the target, was used.

Subsequently, the substrate 11 was heated to 500° C. in the sputtering apparatus. After nitrogen gas was introduced into the apparatus at a flow rate of 15 sccm, the pressure inside the chamber was maintained at 1.0 Pa, a high-frequency bias of 50 W was applied to a side of the substrate 11, and the surface of the substrate 11 was cleaned by exposing it to the nitrogen plasma.

Subsequently, while maintaining the temperature of the substrate 11 at the same temperature, argon gas and nitrogen gas were introduced into the sputtering apparatus. Then, a high-frequency bias of 2000 W was applied to a metal aluminum target; the pressure inside the furnace was maintained at 0.5 Pa, and argon gas and nitrogen gas were circulated therein at 5 sccm and 15 sccm, respectively (the ratio of nitrogen to the total gas was 75%), and a single crystal intermediate layer 12 made of AlN was formed on the sapphire substrate 11.

The magnet inside the target was swung during either cleaning the substrate 11 or forming of the film.

When the AlN layer (intermediate layer 12) having a thickness of 40 nm was formed by conducting the deposition for a predetermined time at a pre-measured film-forming rate (0.067 nm/s), the sputtering operation was terminated, and the temperature of the substrate 11 was cooled.

According to the same procedures as described above, test samples each having an AlN intermediate layer formed on the sapphire substrate were prepared according to six standards, that is, argon gas was circulated at 20 sccm (the ratio of nitrogen to the total gas was 0%); argon gas and nitrogen gas were circulated therein at 16 sccm and 4 sccm (the ratio of nitrogen to the total gas was 20%); argon gas and nitrogen gas were circulated therein at 12 sccm and 8 sccm (the ratio of nitrogen to the total gas was 40%); argon gas and nitrogen gas were circulated therein at 8 sccm and 12 sccm (the ratio of nitrogen to the total gas was 60%); where argon gas and nitrogen gas were circulated therein at 4 sccm and 16 sccm (the ratio of nitrogen to the total gas was 80%); and only nitrogen gas was circulated at 20 sccm (the ratio of nitrogen to the total gas was 100%), respectively, while the sputtering time was fixed in every standard. The magnet inside the target was swung during cleaning the substrate and forming of those films.

When the 40 nm thick AlN layer (intermediate layer 12) was formed by conducting the treatment for a predetermined time at a pre-measured film-forming rate (0.067 nm/s), the plasma operation was terminated, and the temperature of the substrate 11 was cooled.

Then, the substrate 11 on which the intermediate layer 12 was formed was taken out from the sputtering apparatus, and was loaded into an MOCVD furnace. Test samples were prepared on the preliminary formed GaN layer (Group-III nitride semiconductor) using the MOCVD method in accordance with the following procedures.

First, the substrate 11 was loaded into the reaction furnace. The substrate 11 was placed on a carbon susceptor for heating in a glove box which was filled with nitrogen gas. The temperature of the substrate 11 was heated to 1150° C. by a heater after nitrogen gas was circulated into the furnace. After it was confirmed that the temperature of the substrate 11 was stable at 1150° C., ammonia was started to circulate in the furnace by opening a valve of an ammonia-feed pipe. Then, hydrogen containing trimethyl gallium (TMG) vapor was introduced into the furnace, as a preliminary treatment for depositing an undercoat layer 14a of GaN-based semiconductor on the intermediate layer 12 on the substrate 1. The amount of ammonia was adjusted such that the V/III ratio was 6000. After the above GaN-based semiconductor was grown for about one hour, the valve of the TMG feed pipe was closed, and the supply of the raw materials to the reaction furnace was terminated, thereby terminating the growth. After the growth of the GaN-based semiconductor was terminated, applying an electric current to the heater was terminated, and the temperature of the substrate 11 was cooled to room temperature.

By conducting the above-described steps, the single crystal intermediate layer 12 made of AlN was formed on the sapphire substrate 11, and a 2 μm thick undercoat layer 14a of an undoped GaN-based semiconductor was formed, and test samples were also prepared.

Then, x-ray rocking curve (XRC) measurement was conducted with respect to the undoped GaN layer (undercoat layer) grown by the above-described method. In this measurement, a Cu β-X-ray emission source was used as the X-ray source, and the measurement was conducted with respect to a (10-10) plane vertical to the (0002) plane that was the orientation plane.

In general, the half-power band width of the XRC spectrum of the (0002) plane is an indicator for crystal evenness (mosaicity), and the XRC spectrum half-power band width of the (10-10) plane is an indicator of dislocation density of crystals (twist).

Figure 6:
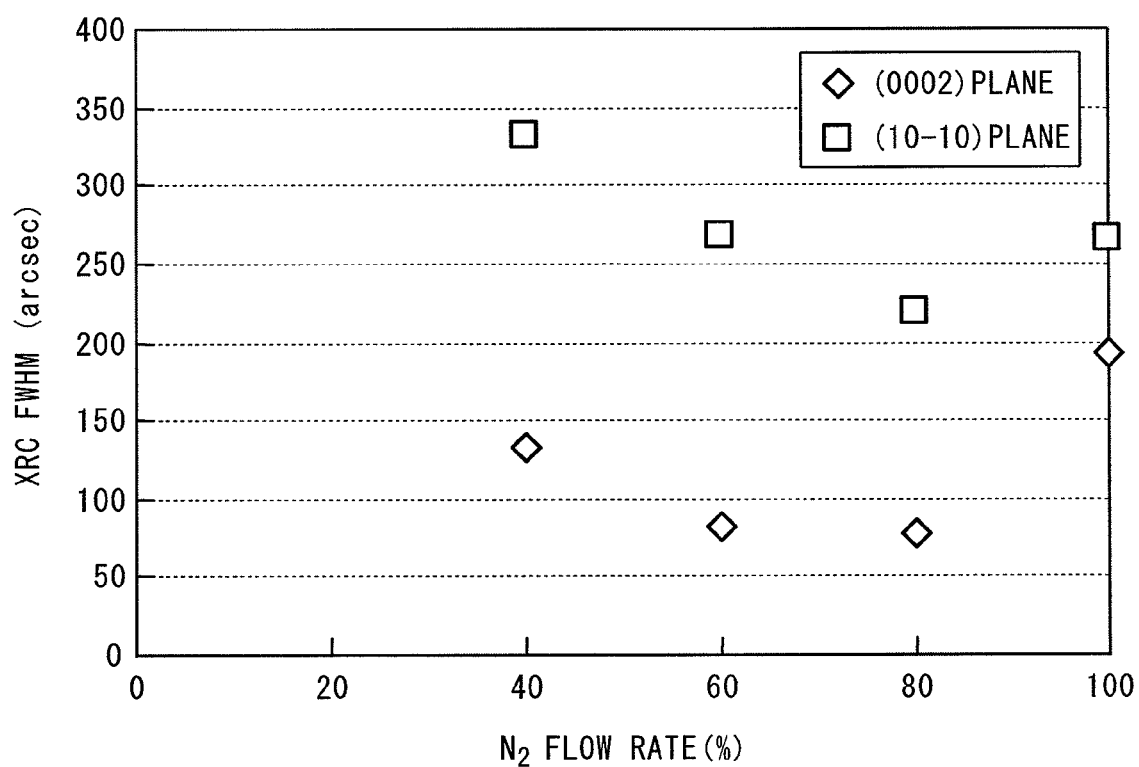
FIG. 6 is a diagram explaining an example of the Group-III nitride semiconductor light-emitting device according to the present invention, and illustrating the half-power band width in a XRC spectrum with respect to the (0002) plane and the (10-10) plane of the undercoat layer.

In FIG. 6 and Table 1, the x-ray rocking curve (XRC) half-power band width is shown with respect to the undoped GaN layer (undercoat layer) formed on the intermediate layer that was grown in each nitrogen concentration as described above.

TABLE 1

|   | N2 (%) | Gas fraction Ar | Gas fraction N2 | GaN (n-type semiconductor layer) (0002) XRC (arcsec) | GaN (n-type semiconductor layer) (10-10) XRC (arcsec) | Surface |
|---|---|---|---|---|---|---|
| 1 | 100 | 0 | 20 | 192.5 | 264.3 | Mirror |
| 2 | 80 | 4 | 16 | 77.8 | 218.8 | Mirror |
| 3 | 60 | 8 | 12 | 81.0 | 267.0 | Mirror |
| 4 | 40 | 12 | 8 | 132.8 | 331.4 | Mirror |
| 5 | 20 | 16 | 4 | — | — | Opaque |
| 6 | 0 | 20 | 0 | — | — | Opaque |

As shown in FIG. 6 and Table 1, when the intermediate layer made of AlN was formed on the substrate using the sputtering method while the nitrogen concentration was adjusted to 40%, the XRC half-power band width of the (0002) plane of the undoped GaN layer formed thereon was 132.8 arcsec, and the XRC half-power band width of the (10-10) plane was 331.4 arcsec. Thus, both values indicate the excellent crystal structure, and it was confirmed that its surface was mirror-like. In Examples, when the intermediate layer was formed where the nitrogen concentration was adjusted to be within a range of 60% to 80%, the crystal structure of the undoped intermediate layer formed thereon was favorable. In particular, when the intermediate layer was formed where the nitrogen concentration was adjusted to 80%, the XRC half-power band width of the (0002) plane of the undoped GaN layer formed thereon was 77.8 arcsec, and the XRC half-power band width of the (10-10) plane was 218.8 arcsec, which indicate that the nitrogen concentration was optimum.

On the other hand, when the intermediate layer was formed where the nitrogen concentration was adjusted to 20% or less, Al was deposited as a metal on the substrate, thereby causing an opaque surface of the intermediate layer. Accordingly, it was impossible to measure its x-ray rocking curve.

Based on the above-described results, it is evident that the Group-III nitride semiconductor light-emitting device of the present invention is highly productive and is provided with excellent light-emitting properties.

INDUSTRIAL APPLICABILITY

The Group-III nitride semiconductor light-emitting device according to the present invention includes a surface layer made of Group-III nitride semiconductor crystals having an excellent crystal structure. Therefore, when a Group-III nitride semiconductor crystal layers having respective functions are further formed on that surface layer, a light-emitting diode (LED), a laser diode (LD), or a semiconductor light-emitting device such as an electronic device that have excellent light-emitting properties can be produced.

The invention claimed is:

1. A method of manufacturing a Group-III nitride semiconductor light-emitting device, comprising:
   activating a gas including a Group-V element and a metal material with plasma, thereby reacting the gas with the metal material, to form, on a substrate, an intermediate layer that is made of a Group-III nitride compound; and
   stacking an n-type semiconductor layer that is made of a Group-III nitride semiconductor, a light-emitting layer, and a p-type semiconductor layer, sequentially on the intermediate layer, said n-type semiconductor layer comprises an undercoat layer and an n-type contact layer, said stacking comprises forming the undercoat layer in an undoped state without supplying a doping element, stacking the undercoat layer on the intermediate layer and stacking the n-type contact layer on the undercoat layer, the n-type contact layer having the same composition as that of the undercoat layer except that the n-type contact layer is doped with an n-type impurity,
   wherein the Group-V element is nitrogen, the gas fraction of nitrogen in the gas is controlled within a range of more than 75% to less than 99% during forming of the intermediate layer, and the intermediate layer is formed into a single crystal structure.

2. The method of manufacturing a Group-III nitride semiconductor light-emitting device according to claim 1, wherein the intermediate layer is formed by a sputtering method.

3. The method of manufacturing a Group-III nitride semiconductor light-emitting device according to claim 2, wherein the intermediate layer is formed by an RF sputtering method.

4. The method of manufacturing a Group-III nitride semiconductor light-emitting device according to claim 3, wherein the intermediate layer is formed by an RF sputtering method while moving a magnet of a cathode.

5. The method of manufacturing a Group-III nitride semiconductor light-emitting device according to claim 2, wherein the intermediate layer is formed by a reactive sputtering method which circulates the gas including a Group-V element inside a chamber.

6. The method of manufacturing a Group-III nitride semiconductor light-emitting device according to claim 1, wherein the metal material includes Al.

7. The method of manufacturing a Group-III nitride semiconductor light-emitting device according to claim 1, wherein the intermediate layer is formed while the temperature of the substrate is within a range of room temperature to 1000° C.

8. The method of manufacturing a Group-III nitride semiconductor light-emitting device according to claim 1, wherein the undercoat layer is formed with a GaN-based compound semiconductor.

9. The method of manufacturing a Group-III nitride semiconductor light-emitting device according to claim 1, wherein the intermediate layer and the undercoat layer are formed with a different Group-III nitride compound from each other.

10. The method of manufacturing a Group-III nitride semiconductor light-emitting device according to claim 1, wherein the undercoat layer is formed on the intermediate layer by a MOCVD method.

11. The method of manufacturing a Group-III nitride semiconductor light-emitting device according to claim 1, wherein the temperature of the substrate is adjusted to be 800° C. or more during forming of the undercoat layer.

* * * * *